(12) United States Patent
Huang et al.

(10) Patent No.: US 6,640,321 B1
(45) Date of Patent: Oct. 28, 2003

(54) BUILT-IN SELF-REPAIR OF SEMICONDUCTOR MEMORY WITH REDUNDANT ROW TESTING USING BACKGROUND PATTERN

(75) Inventors: Johnnie A. Huang, Santa Clara, CA (US); Ghasi R. Agrawal, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/549,621

(22) Filed: Apr. 14, 2000

(51) Int. Cl.[7] .............................................. G11C 29/00
(52) U.S. Cl. ...................................... 714/720; 714/718
(58) Field of Search ................................. 714/718, 720, 714/713, 738; 395/182.05, 182; 702/123; 711/713; 365/201

(56) References Cited

U.S. PATENT DOCUMENTS

| | | | | |
|---|---|---|---|---|
| 5,541,942 A | * | 7/1996 | Strouss ...................... 371/21.2 |
| 5,758,056 A | * | 5/1998 | Barr ....................... 395/182.05 |
| 5,764,878 A | * | 6/1998 | Kablanian et al. ...... 395/182.02 |
| 6,035,432 A | * | 3/2000 | Jeddeloh ...................... 714/763 |
| 6,385,746 B1 | * | 5/2002 | Tatsumi ....................... 714/718 |
| 6,449,704 B1 | * | 9/2002 | Takano ........................ 711/713 |

FOREIGN PATENT DOCUMENTS

EP 0889409 A1 * 7/1999 ........... G06F/11/20

* cited by examiner

Primary Examiner—Christine T. Tu
Assistant Examiner—Mujtaba Chaudry
(74) Attorney, Agent, or Firm—Conley, Rose & Tayon

(57) ABSTRACT

A method is presented for self-test and self-repair of a semiconductor memory device. Prior to the self-repair stage, both redundant and regular memory portions are comprehensively tested, preferably using a checkerboard bit pattern. Faulty rows identified in each memory portion during testing are recorded. Known-bad rows in regular memory are then replaced by known-good redundant rows in the self-repair stage, and the resulting repaired memory is retested for verification. Compared to existing methods, the new method is believed to provide improved test coverage, making it both more effective in identifying non-repairable memory devices and less prone to fail repairable ones.

24 Claims, 6 Drawing Sheets

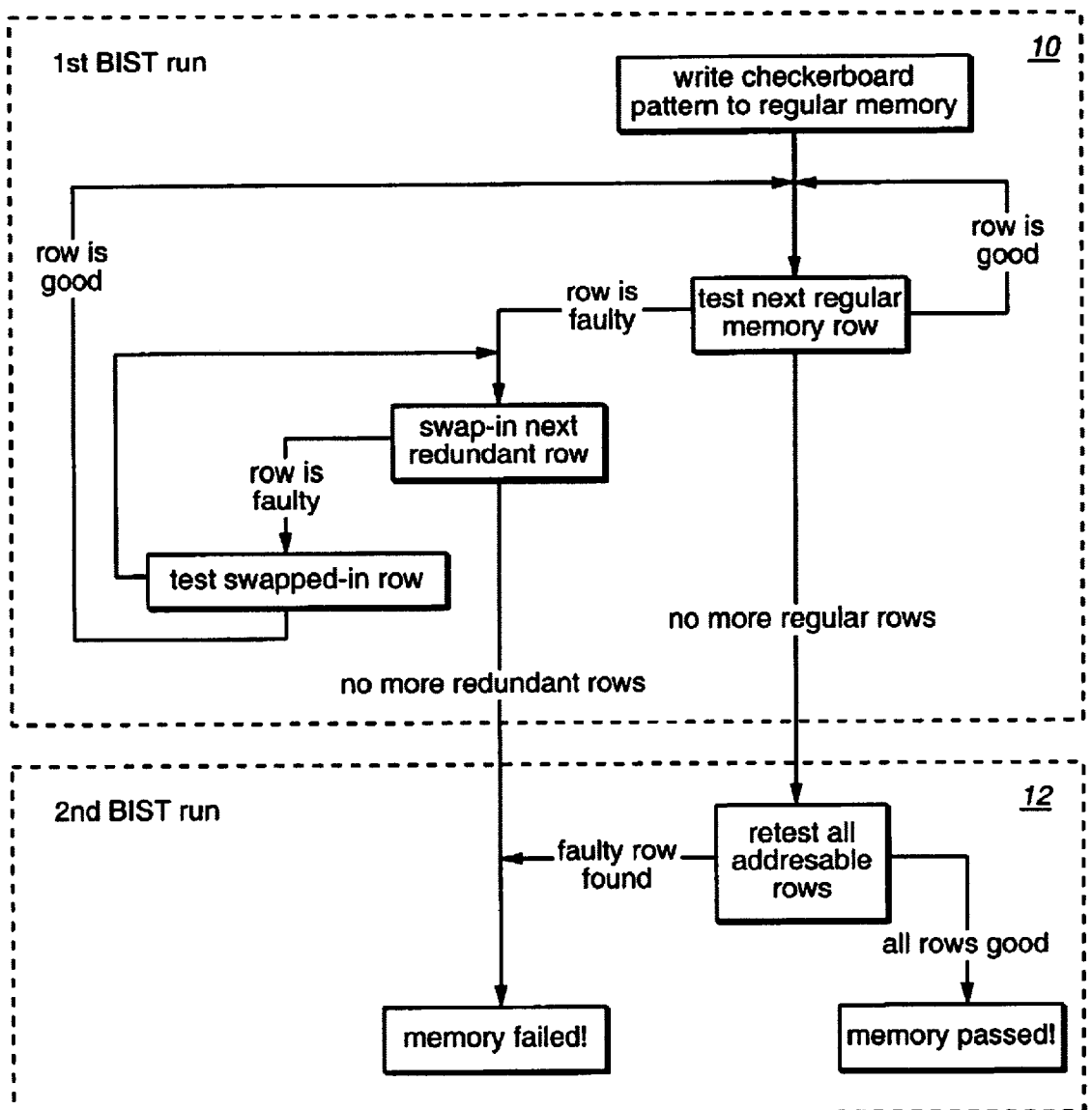
FIG._1

|  | Col 0 | Col 1 | Col 2 | Col 3 | Col 4 | | Col n-1 |
|---|---|---|---|---|---|---|---|
| Row m-1 | 0 | 1 | 0 | 1 | 0 | | 1 |
| ≈ | ≈ | ≈ | ≈ | ≈ | ≈ | ≈ | ≈ |
| Row 4 | 1 | 0 | 1 | 0 | 1 | | 0 |
| Row 3 | 0 | 1 | 0 | 1 | 0 | | 1 |
| Row 2 | 1 | 0 | 1 | 0 | 1 | | 0 |
| Row 1 | 0 | 1 | 0 | 1 | 0 | | 1 |
| Row 0 | 1 | 0 | 1 | 0 | 1 | | 0 |
| RRow 0 | 0 | 1 | 0 | 1 | 0 | | 1 |
| RRow 1 | 1 | 0 | 1 | 0 | 1 | | 0 |
| RRow 2 | 0 | 1 | 0 | 1 | 0 | | 1 |
| RRow 3 | 1 | 0 | 1 | 0 | 1 | | 0 |
| ≈ | ≈ | ≈ | ≈ | ≈ | ≈ | ≈ | ≈ |
| RRow p-1 | 1 | 0 | 1 | 0 | 1 | | 0 |

FIG._2

|  | Col 0 | Col 1 | Col 2 | Col 3 | Col 4 | | Col n-1 |
|---|---|---|---|---|---|---|---|
| Row m-1 | 0 | 1 | 0 | 1 | 0 | | 1 |
| Row 4 | 1 | 0 | 1 | 0 | 1 | | 0 |
| Row 3 | 0 | 1 | 0 | 1 | 0 | | 1 |
| Row 2 | 1 | 0 | 1 | 0 | 1 | | 0 |
| Row 1 | 0 | 1 | 0 | 1 | 0 | | 1 |
| Row 0 | 1 | 0 | 1 | 0 | 1 | | 0 |

FIG._3A

|  | Col 0 | Col 1 | Col 2 | Col 3 | Col 4 | | Col n-1 |
|---|---|---|---|---|---|---|---|
| Row m-1 | 0 | 1 | 0 | 1 | 0 | | 1 |
| Row 4 | 1 | 0 | 1 | 0 | 1 | | 0 |
| Row 3 | 0 | 0 | 0 | 1 | 0 | | 1 |
| Row 2 | 1 | 0 | 1 | 0 | 1 | | 0 |
| Row 1 | 0 | 1 | 0 | 1 | 0 | | 1 |
| Row 0 | 1 | 0 | 1 | 0 | 1 | | 0 |

FIG._3B

| | | | | | | |
|---|---|---|---|---|---|---|
| Row 4 | 1 | 0 | 1 | 0 | 1 | 0 |
| Row 3 | 0 | 1 | 0 | 1 | 0 | 1 |
| Row 2 | 1 | 0 | 1 | 0 | 1 | 0 |
| Row 1 | 0 | 1 | 0 | 1 | 0 | 1 |
| Row 0 | 1 | 0 | 1 | 0 | 1 | 0 |
| RRow 0 | X | X | X | X | X | X |
| RRow 1 | X | X | X | X | X | X |
| RRow 2 | X | X | X | X | X | X |
| RRow 3 | X | X | X | X | X | X |

FIG._4A

| | | | | | | |
|---|---|---|---|---|---|---|
| Row 4 | 1 | 0 | 1 | 0 | 1 | 0 |
| Row 3 | 0 | 1 | 0 | 1 | 0 | 1 |
| Row 2 | 1 | 0 | 1 | 0 | 1 | 0 |
| Row 1 | 0 | 1 | 0 | 1 | 0 | 1 |
| Row 0 | 1 | 0 | 1 | 0 | 1 | 0 |
| RRow 0 | 1 | 0 | 1 | 0 | 1 | 0 |
| RRow 1 | 1 | 0 | 1 | 0 | 1 | 0 |
| RRow 2 | X | X | X | X | X | X |
| RRow 3 | X | X | X | X | X | X |

FIG._4B

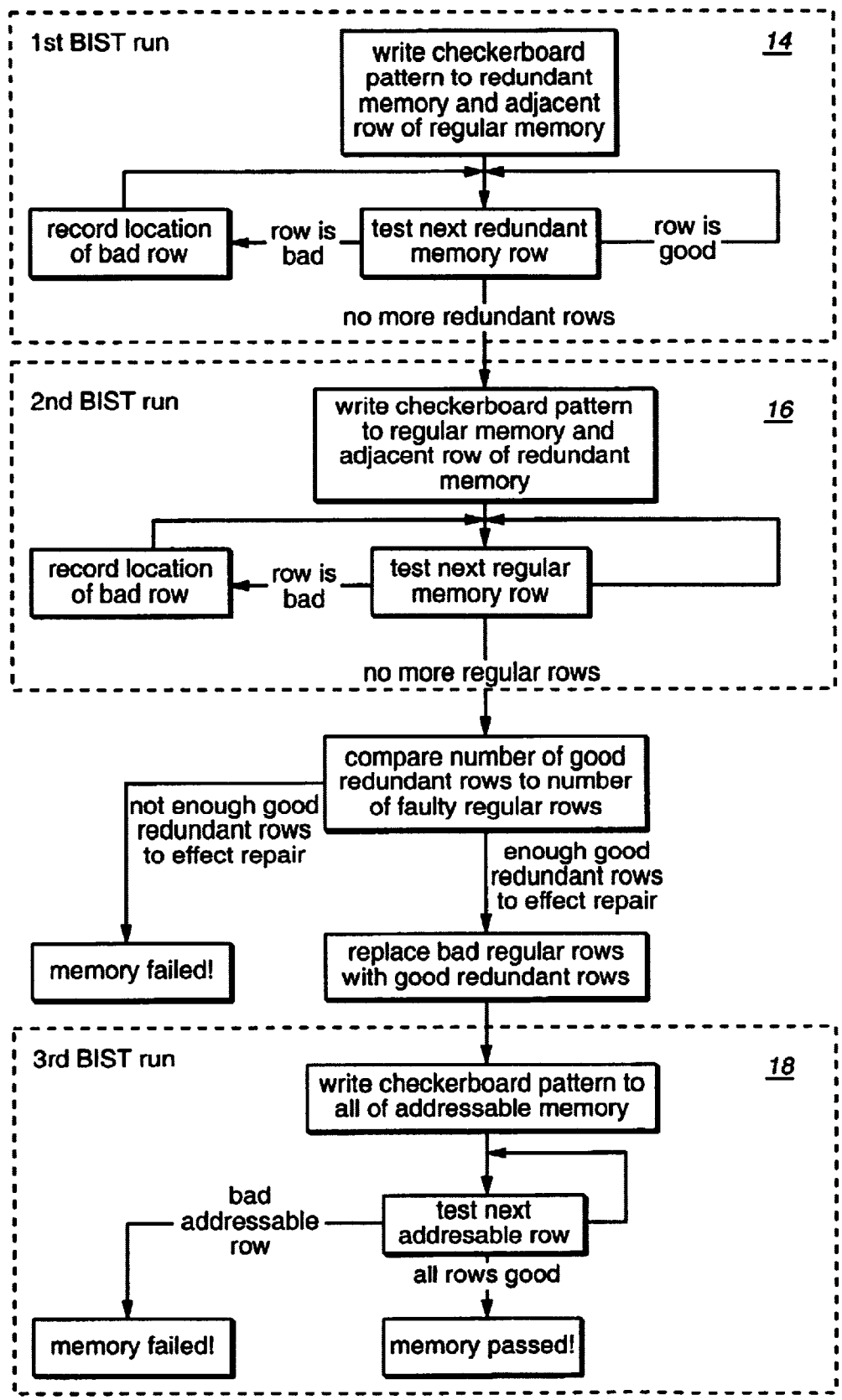
FIG._5

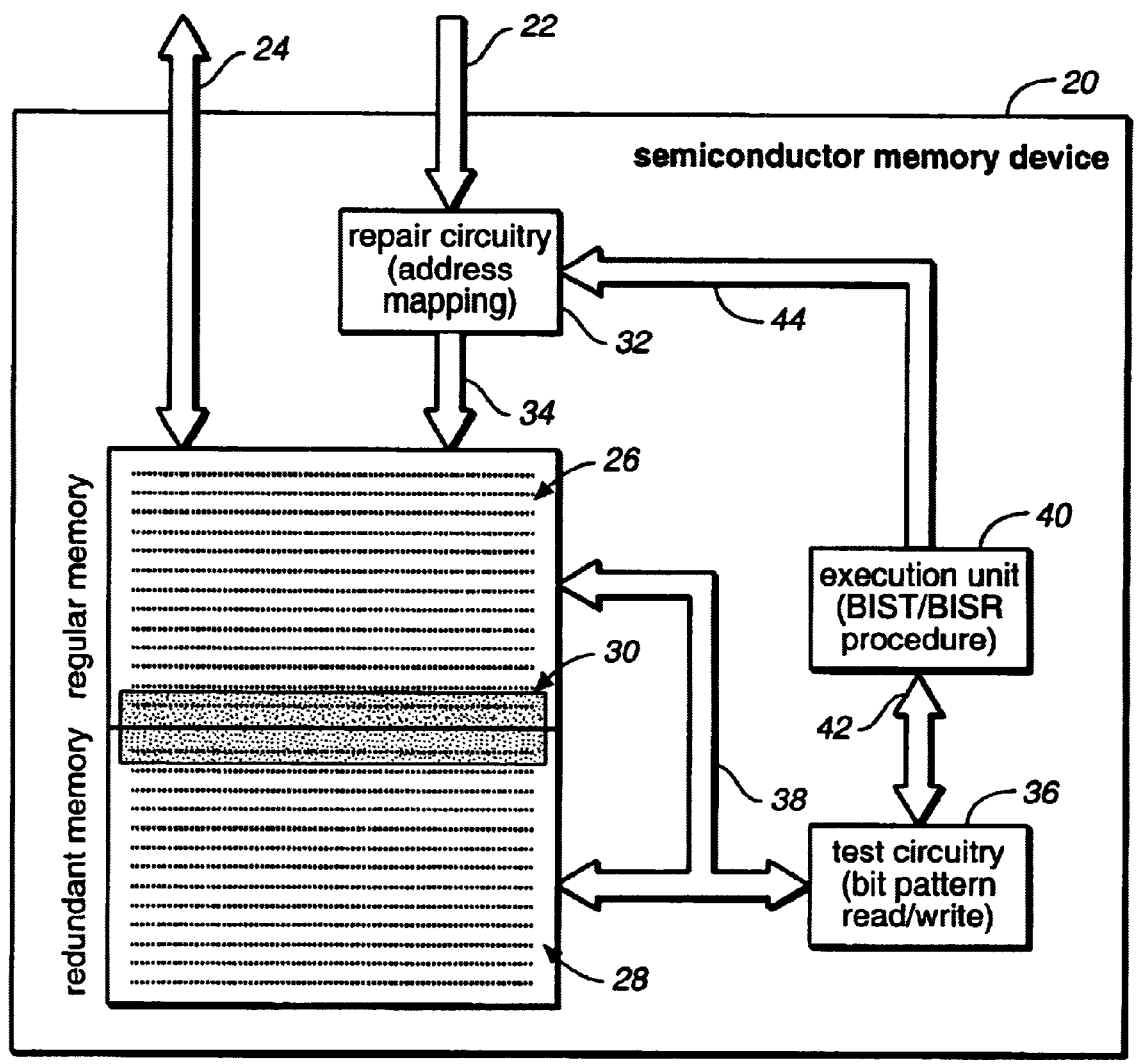
FIG._6

BUILT-IN SELF-REPAIR OF SEMICONDUCTOR MEMORY WITH REDUNDANT ROW TESTING USING BACKGROUND PATTERN

BACKGROUND OF THE INVENTION

1. Field of Invention

This invention relates to semiconductor memory and, more particularly, to test and repair of semiconductor memory.

2. Description of Related Art

Semiconductor memory is a crucial resource in modern computers, being used for data storage and program execution. With the exception of the central processor itself, no other component within the computer experiences as high a level of activity. Traditional trends in memory technology are toward greater density (more memory locations, or "cells", per part), higher speed and improved reliability. To some extent, these goals are inconsistent. For example, as memory density increases, the incidence of defects also rises. As a result, production yields of high-density memory devices with zero defects would be so low as to render them prohibitively costly. However, an alternative to building perfect devices is to build spare memory cells into the devices, along with internal circuitry capable of detecting bad cells. Additional internal circuitry swaps good cells for known-bad ones, with no degradation in performance. Therefore, as long as there are sufficiently many working cells to replace the defective ones, a fully functional memory device can be made. The techniques for internally detecting faulty memory cells and for replacing them with working cells are commonly referred to as built-in self-test (hereinafter, "BIST") and built-in self-repair (hereinafter, "BISR"), respectively. BIST and BISR are instrumental in obtaining acceptable yields in the manufacture of high-performance semiconductor memory.

Conventional memory devices are typically organized as a matrix of rows and columns, in which each individual cell has a unique row/column address. A popular memory architecture incorporating the above-described BIST and BISR techniques configures spare memory locations as redundant rows. Thus, a nominal m×n memory device is actually configured as m rows and n columns of regular memory, and with p rows (and n columns) of redundant memory. Redundant memory rows are not part of the nominal m×n address space of the device, except when used to replace defective regular rows. Circuitry within the memory device itself performs both the test (BIST) and repair functions. During BIST, this circuitry generates test patterns to identify faulty memory locations. Then, during BISR, it reroutes internal connections, circumventing these locations and effectively replacing defective rows of regular memory with working redundant rows.

Most currently used BIST/BISR methods do not completely test the redundant rows in the memory device, but only those that are actually swapped in to replace regular memory locations that have failed. If there are enough redundant rows to replace every faulty row in the regular memory, the BIST routine certifies the memory as repairable; otherwise, it is considered non-repairable. As discussed in greater detail below, these BIST routines are not completely reliable.

A memory test generally involves writing a specific bit pattern to a range of memory cells, then reading back the values actually stored and comparing them to the desired pattern. This method can be used to locate faulty memory cells, or to detect interactions between adjacent rows, in which certain cells tend to follow the logic transitions of neighboring cells.

Typically, testing involves two BIST runs, as illustrated in FIG. 1. During the first BIST run 10, the regular memory is tested row by row; if a faulty row is found (i.e., one that contains a bad cell) it is replaced by the first available redundant row. The replacement row is then tested. If that row is good, testing proceeds with the next regular memory row; otherwise, the next available redundant row is swapped in and tested. This process continues until either all of the addressable memory has tested good, or there are no more redundant rows to use as replacements. In the first case, a second BIST run 12 is performed, verifying all addressable memory locations; in the second case, the memory device is flagged as non-repairable and the second BIST run 12 is skipped. Upon successful completion of the second run, the memory is certified as good. If any faulty rows are found however, the memory is classified as non-repairable. No further swapping of redundant rows for faulty rows is typically performed during second BIST run 12.

The conventional BIST/BISR method suffers from several deficiencies. In the first place, the test routine does not test redundant memory rows until they are swapped into the addressable memory, i.e., until they are used to replace faulty rows of regular memory. This means that a test for adjacent row interaction is not done on the redundant rows before they are used as replacements. Furthermore, if row m of regular memory is found to be faulty, it is immediately replaced by a redundant row. But then row m+1 never receives a proper test for adjacent row interaction, since one of its two neighboring rows (i.e., row m) has been replaced before row m+1 is tested.

Either of the above scenarios may result in a faulty memory being certified as repairable. To make matters worse, the conventional BIST/BISR method may also flag a potentially repairable memory as bad. To understand how this can occur, consider a memory device in which regular rows 2 and 4 have shorted cells, and redundant rows 0 and 1 interact with one another. During the first BIST run, regular row 2 is replaced by redundant row 0, which is then tested. Since redundant row 0 does not contain any shorted cells, it will test good, and the first BIST run resumes its test of regular memory with row 3. Row 4, being faulty, will then be replaced by redundant row 1, followed by a simple test of redundant row 1. Since there are presumably no shorted cells, this test will also pass. After the remainder of regular memory has been tested, the first BIST run is concluded and a second BIST run is performed on the entire addressable memory. This time, the test reveals the previously undetected interaction between redundant rows 0 and 1, and the memory is flagged as non-repairable. But in fact, this memory could actually have been repairable, since there may have been other available redundant memory rows that could have been swapped in to replace regular rows 2 and 4. Clearly, such false failure indications will adversely impact device production yields.

An additional drawback to the conventional BIST/BISR method is that total test time is not readily predictable. The duration of the test is dependent on the number of bad regular memory rows, each of which has to be replaced and retested. Since there is no way to know this in advance, precise test scheduling during production is impossible.

In view of the above-mentioned problems, it would be beneficial to have a more complete and robust method for self-test and self-repair of semiconductor memory devices.

SUMMARY OF THE INVENTION

The problems outlined above are in large part solved by a BIST/BISR method that completely tests both the redundant rows and the regular memory, and is capable of detecting interaction between adjacent memory rows. Only after such a complete test is performed, are redundant rows swapped for regular memory rows containing faulty cells. This ensures that potential errors resulting from interaction between rows will not be overlooked during the BIST/BISR procedure. The new method is believed to offer improved reliability over the conventional method, resulting in fewer bad memories flagged as good, and fewer good memories flagged as bad. It also has the advantage that the total test time is consistent and predictable, which benefits test scheduling.

The improved BIST/BISR routine may include three BIST runs. In an exemplary embodiment, the redundant memory rows are tested during the first run, and the regular memory rows during the second run. If the number of faulty rows of regular memory is greater than the number of available good rows of redundant memory the test ends, and the memory device is flagged as non-repairable. Otherwise, in the third run, known-good redundant rows are used to replace known-bad rows in regular memory, and the entire addressable memory is retested for verification. Testing of regular and redundant memory preferably comprises, but is not limited to, writing a checkerboard physical pattern to the memory cells, to detect defective cells and row interaction. Furthermore, in some embodiments the first and second BIST runs may be combined, so that both regular and redundant memory portions are collectively tested in a single BIST run. Alternatively, the improved BIST/BISR routine may be combined with other test routines, increasing the number of BIST runs to four or more.

A computer-usable carrier medium having program instructions executable to implement the above-described BIST/BISR method is also contemplated herein. The carrier medium may be a storage medium, such as a magnetic or optical disk, a magnetic tape, or a memory. In addition, the carrier medium may be a wire, cable, or wireless medium along which the program instructions are transmitted, or a signal carrying the program instructions along such a wire, cable or wireless medium. In an embodiment, the carrier medium may contain program instructions in a hardware description language, such as Verilog, to configure circuitry within the memory device capable of implementing the BIST/BISR routine.

In addition to the above-mentioned improved BIST/BISR method and computer-usable medium, a system for implementing the method is contemplated herein. The system may comprise first and second portions of the memory, along with test circuitry and repair circuitry, all of which reside within the memory device. The test circuitry is adapted to test the entirety of the first and second memory portions and to detect rows within them that fail the test. The repair circuitry is adapted to replace failed rows in the first memory portion with non-failing rows from the second memory portion, thereby creating a third memory portion. The test circuitry is further adapted to test this third memory portion, and flag the memory device as non-repairable if any rows within the third memory portion fail the test. In an embodiment, the test and repair circuitry are controlled by an execution unit, such as a state machine. The execution unit may be configured using program instructions such as those above.

BRIEF DESCRIPTION OF THE DRAWINGS

Other objects and advantages of the invention will become apparent upon reading the Detailed Description and upon reference to the accompanying drawings in which:

FIG. 1 is a flowchart of a conventional BIST/BISR routine;

FIG. 2 illustrates a checkerboard pattern written to an m×n memory with p rows of redundant memory;

FIGS. 3a and 3b illustrate a checkerboard pattern written to a typical m×n matrix of memory locations, and the resultant pattern that is read back when one of the cells is faulty;

FIGS. 4a and 4b illustrate swapping of redundant rows for regular rows using a conventional BIST/BISR routine;

FIG. 5 is a flowchart of an embodiment of the improved BIST/BISR routine described herein; and FIG. 6 illustrates an embodiment of a system for implementing the methods described herein.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

A typical memory device, as considered herein and shown in FIG. 2, is organized as m×n cells of regular (i.e., addressable) memory and p×n cells of redundant memory. The use of redundant memory locations, together with on-chip circuitry for testing memory cells and remapping memory addresses, permits built-in self-test (BIST) and built-in self-repair (BISR) of memory devices. The redundant rows, RRow 0–RRow p−1, are depicted in FIG. 2 as being contiguous with the regular rows, Row 0–Row m−1, with RRow 0 adjacent to Row 0. However, it should be understood that the configuration shown is merely exemplary, and other embodiments are consistent with the method contemplated herein.

A common memory test consists of writing a "checkerboard" pattern to all the memory locations and then reading it back. This test consists of placing alternating 1's and 0's in all the locations, and then verifying that the written values were actually stored in those locations. If a particular cell is defective it will appear as a discrepancy in the checkerboard pattern when it is read back. A cell that cannot be written to will in effect be "stuck" at either a 1 or 0. An attempt to write the opposite value to that cell will fail, and will show up as an anomaly in the checkerboard upon reading back the memory. As an example, assume that the memory location in column 1 of row 3 is defective and is stuck at logic level 0. The checkerboard pattern shown in FIG. 3a attempts to write a logic level 1 to the faulty cell, but when the memory is read back the resulting pattern is as shown in FIG. 3b. The anomalous occurrence of a 0 in column 1 of row 3 indicates that the written value was not stored, indicating a bad memory cell. Note that two complementary checkerboard patterns are required for a complete test, since this ensures that each cell is tested with both a 1 and a 0.

The checkerboard pattern can also be used to detect interaction between adjacent rows. In such cases, certain cells tend to follow the logic transitions of neighboring cells. As an example, assume the memory cell in column 3 of row 2 is initially at logic state 0, but that it interacts with an adjacent cell (e.g., column 3 of row 3). When the neighboring cell in row 3 is set to logic state 1, the interacting cell changes along with it. As noted in the previous example, the checkerboard pattern writes alternating logic states to adjacent cells. When the memory is read back, the error induced by interaction with the adjacent row is revealed as an anomalous bit pattern in the checkerboard pattern.

Existing BIST/BISR routines perform self-test and self-repair functions concurrently. In the first BIST run, the addressable memory is tested row-by-row and defective regular memory rows are replaced with redundant memory rows on an as-needed basis. A comprehensive test of the addressable memory is performed only in the second BIST run. As described earlier, such methods may be prone to overlook certain types of memory errors, with the possible result that defective devices are certified as good, or good devices flagged as bad.

An example illustrating a disadvantage of existing BIST/BISR routines is presented in FIGS. 4a and 4b. Note that the redundant memory rows have indeterminate logic values (shown as X's), since they are not pre-tested by the conventional BIST routine. A defect (indicated by shadowed cell) is detected in regular memory row 2 during the first BIST run, so redundant row 0 is swapped in as a replacement and tested. Now, suppose that regular row 4 is also found to be defective. This time, redundant row 1 is swapped in and tested. The result of these substitutions is shown in FIG. 4b. Observe that the replacement of faulty regular rows by redundant rows disrupts the checkerboard bit pattern in the vicinity of regular row 0, which means that adjacent row interaction is not detectable.

To obtain more rigorous and complete test coverage of the memory device, the improved BIST/BISR method described herein tests the entire redundant memory and regular memory portions of the memory device before implementing self-repair. In an exemplary embodiment, the routine includes three BIST runs, as represented in the flowchart in FIG. 5. The redundant memory is tested in the first BIST run 14, before testing the regular memory. A checkerboard test pattern is applied to the entire redundant memory, along with the contiguous row of regular memory. For example, observe that in FIG. 2 regular memory row Row 0 is directly adjacent redundant memory row RRow 0. To detect possible adjacent row interaction at RRow 0 it is therefore necessary to include Row 0 in the checkerboard pattern. Any redundant rows that fail this test are recorded.

Following the comprehensive test of redundant memory in the first BIST run 14, a similar test may be performed on regular memory in the second BIST run 16. For completeness, the contiguous redundant row may be included in the checkerboard pattern, although, this combination has already been exercised in previous BIST run 14. Any regular memory rows that fail this test are recorded.

It should be noted that the sequence is not significant and could be reversed, so that regular memory is tested prior to testing redundant memory. Also, in some embodiments, testing of both memory portions could be combined in a single BIST run, resulting in a two-stage BIST/BISR routine.

In the embodiment of FIG. 5, self-repair is implemented prior to the third BIST run 18. However, self-repair is attempted only if the previous BIST runs indicated enough good redundant rows to replace all the faulty regular rows; otherwise, the test aborts at the end of the second BIST run. Since all of the failed redundant rows were recorded during the first BIST run 14, only known-good redundant rows are used to replace faulty regular memory rows. And since the faulty regular memory rows were identified during the second BIST run 16, the replacement may be done not on a row-by-row basis, but in a single repair step. If the number of available known-good redundant rows is not sufficient to replace all of the known-bad regular rows, the memory will be failed before starting the third BIST run 18. Otherwise, the third BIST run 18 performs a verification test on the repaired addressable memory. If any errors are detected during the third BIST run the memory is failed; otherwise, it is certified as good. In various embodiments, the method described herein may be combined with other test procedures, resulting in four or more BIST runs.

With the conventional BIST/BISR method shown in FIG. 1, it is possible to replace a pair of adjacent rows of regular memory with a pair of redundant rows that exhibit interaction. The reason this can occur is because the conventional routine does not test redundant rows for interaction before substituting them for faulty regular rows. The interacting adjacent rows will be discovered only in the second (and final) BIST run 12, and the memory device will be flagged as non-repairable. The improved BIST/BISR routine of FIG. 5 avoids such a scenario. Since the redundant rows are comprehensively tested before any of them are used to replace faulty regular memory rows, there is little chance that adjacent row interaction can go undetected until the final BIST run 18. It is believed that the improved BIST/BISR routine constitutes a much more robust test of the memory device than the presently used BIST/BISR routine.

A further advantage of the improved BIST/BISR method is that the total test time is consistent and predictable. The total test time required by the conventional method is dependent on a variety of factors, such as the number of failed regular rows that have to be replaced. Since these factors cannot be known in advance, it is impossible to predict the duration of the test. In contrast, the total test time required by the improved BIST/BISR routine is represented by the sum of the following:

1. time required to test redundant memory
2. time required to test regular memory
3. time required to replace faulty regular rows with good redundant rows 4. time required for final verification test of addressable memory Items 1, 2 and 4 are of fixed duration for a given size of the memory. Once the redundant and regular memory portions have been tested, item 3 is essentially a single operation, whose duration is substantially independent of the number of rows being replaced. Total test time would vary only if a memory device contained so many bad regular rows that not enough redundant rows were available to replace them. Since the total test time is predictable, it is easier to schedule production testing of mass-produced memory devices incorporating the improved method.

BIST/BISR routines are typically implemented in some form of execution device, such as a state machine, using circuitry internal to the memory device. Resources required for implementation of the improved BIST/BISR routine are not significantly different or more extensive than would be needed for implementation of existing routines, so its incorporation into memory devices is believed to be straightforward.

FIG. 6 illustrates an exemplary embodiment of a system for implementing the improved BIST/BISR routine described herein. Shown within a semiconductor memory device 20 are the regular memory rows 26 and redundant memory rows 28, including adjacent regular and redundant rows 30. Address bus 22 and data bus 24 provide external access to the memory resources of the device. Mapping of external addresses 22 to either regular 26 or redundant 28 memory portions is defined by the repair circuitry 32, which can be programmed to reassign addresses, effectively bypassing faulty regular rows in favor of working redundant rows. These remapped addresses appear on internal address bus 34. Test circuitry 36 is capable of writing bit patterns to both regular and redundant memory portions, and of reading back the stored bit patterns via bi-directional internal bus 38. Execution unit 40 implements the BIST/BISR routine and controls test circuitry 36 over bi-directional bus 42. The execution unit also configures the addressable memory by programming repair circuitry 32 over bus 44.

The improved BIST/BISR routine may be represented in the form of computer program instructions or a device description in a hardware description language, such as Verilog. These instructions or description may reside on a computer-usable carrier medium, as described earlier, from which the routine can be embodied in on-chip circuitry, such as execution unit 40, when the memory device is fabricated.

It will be appreciated by those skilled in the art having the benefit of this disclosure that this invention is believed to present a system and method for built-in self-test and self-repair of a semiconductor memory. Further modifications and alternative embodiments of various aspects of the invention will be apparent to those skilled in the art in view of this description. Such details as the number and order of BIST runs described herein are exemplary of a particular embodiment. It is intended that the following claims be interpreted to embrace all such modifications and changes and, accordingly, the specification and drawings are to be regarded in an illustrative rather than a restrictive sense.

What is claimed is:

1. A method for self-test and self-repair of a semiconductor memory, comprising:

testing the entirety of a first portion of the memory comprising a matrix of rows and columns, and recording which rows fail the test;

testing the entirety of a second portion of the memory comprising a matrix of rows and columns, and recording which rows fail the test;

replacing failed rows in the second portion of memory with rows that did not fail in the first portion; and testing a third portion of the memory comprising non-failing rows from the second portion, together with replacement rows obtained from the first portion.

2. The method as recited in claim 1, wherein said testing comprises:

writing a first bit pattern to said first and second portions of memory;

reading a second bit pattern from said first and second portions of memory; and comparing the first bit pattern to the second bit pattern.

3. The method as recited in claim 2, wherein said bit pattern comprises a sequence of 1's and 0's alternating within each row and within each column.

4. The method as recited in claim 2, wherein said bit pattern comprises a sequence of all 1's, or all 0's.

5. The method as recited in claim 2, wherein said testing assigns a "fail" result to any row for which said first bit pattern differs from said second bit pattern, and otherwise assigns a "pass" result.

6. The method as recited in claim 1, wherein said testing is accomplished using circuitry intrinsic to the semiconductor memory.

7. The method as recited in claim 1, wherein said replacing comprises reconfiguring internal connections so that addresses formerly associated with rows being replaced are redirected to rows being used as replacements.

8. The method as recited in claim 7, wherein said replacing is accomplished using circuitry intrinsic to the semiconductor memory.

9. The method as recited in claim 1, wherein the first portion of memory comprises redundant memory, and the second portion of memory comprises regular memory.

10. The method as recited in claim 1, wherein testing the entirety of a first portion of the memory comprises a first built-in self-test (BIST) run, testing the entirety of a second portion of the memory comprises a second BIST run, and testing a third portion of the memory comprises a third BIST run.

11. The method as recited in claim 1, wherein said first and second portions of memory are contiguous, and testing of the entirety of both portions comprises a single BIST run.

12. A system for self-test and self-repair of a semiconductor memory, said system comprising:

first portion of the memory, comprising a matrix of rows and columns;

a second portion of the memory, comprising a matrix of rows and columns;

test circuitry adapted to test each of the first and second portions and detect rows failing the test, wherein the test circuit is further adapted to test the entirety of each portion; and repair circuitry adapted to replace failed rows in the second portion with non-failing rows from the first portion.

13. The system as recited in claim 12, wherein the test circuitry comprises logic adapted to write a first bit pattern to a portion of memory, read a second bit pattern from said portion of memory, and compare the first bit pattern to the second.

14. The system as recited in claim 12, wherein the test circuitry further comprises logic adapted to compare the number of failed rows from the second portion of memory to the number of non-failed rows from the first portion of memory.

15. The system as recited in claim 12, wherein the test circuitry is further adapted to test a third portion of memory, comprising non-failing rows from the first portion and non-failing rows from the second portion.

16. The system as recited in claim 12, further comprising an execution device capable of implementing a state machine or similar sequential computational procedure.

17. The system as recited in claim 12, wherein the repair circuitry comprises switching components capable of reconfiguring memory portions, such that selected rows within said first portion of memory may be used to replace other selected rows within said second portion of memory.

18. The system as recited in claim 12, wherein the testing circuitry and repair circuitry reside within the memory device.

19. A computer-usable carrier medium, comprising:

first program instructions defining operations performable by an execution unit for testing the entirety of a first portion of memory associated with the execution unit, and for recording which rows within the first portion fail the test;

second program instructions defining operations performable by the execution unit for testing the entirety of a second portion of the memory associated with the execution unit and recording which rows within the second portion fail the test; and third program instructions defining operations performable by the execution unit for testing a third portion of the memory and recording which rows within the third portion fail the test, wherein said third portion comprises non-failing rows from the first portion and non-failing rows from the second portion.

20. The computer-usable carrier medium as recited in claim 19, wherein said execution unit comprises a sequential computational engine.

21. The computer-usable carrier medium as recited in claim 20, wherein said sequential computational engine comprises a state-machine.

22. The computer-usable carrier medium as recited in claim 19, wherein said program instructions comprise a hardware description language.

23. The computer-usable carrier medium as recited in claim 22, wherein said hardware description language comprises Verilog.

24. The computer-usable carrier medium as recited in claim 19, wherein said program instructions are executable on a computer running a software simulator, such that all possible operations of the execution unit can be simulated.

* * * * *